United States Patent [19]

Yarbrough et al.

[11] Patent Number: 5,118,974
[45] Date of Patent: Jun. 2, 1992

[54] TRISTATE CIRCUITS WITH FAST AND SLOW OE SIGNALS

[75] Inventors: Roy L. Yarbrough, Hirma; Duane G. Quiet, Portland, both of Me.

[73] Assignee: National Semiconductor Corporation, Santa Clara, Calif.

[21] Appl. No.: 555,718

[22] Filed: Jul. 19, 1990

[51] Int. Cl.⁵ ................... H03K 19/092; H03K 19/00
[52] U.S. Cl. ................... 307/473; 307/475; 307/456; 307/300
[58] Field of Search .............. 307/473, 475, 456, 300

[56] References Cited

U.S. PATENT DOCUMENTS

| | | | |
|---|---|---|---|
| 4,311,927 | 1/1982 | Ferris | 307/473 |
| 4,321,490 | 3/1982 | Bechdolt | 307/456 |
| 4,339,675 | 7/1982 | Ransey | 307/473 |
| 4,529,895 | 7/1985 | Garverick et al. | 307/473 |
| 4,581,550 | 4/1986 | Ferris et al. | 307/473 |
| 4,585,959 | 4/1986 | Baskett et al. | 307/473 |
| 4,649,297 | 3/1987 | Vazehgoo | 307/456 |
| 4,896,056 | 1/1990 | Kunieda et al. | 307/475 |
| 4,945,264 | 7/1990 | Lee et al. | 307/443 |
| 4,973,862 | 11/1990 | Luich et al. | 307/473 |

Primary Examiner—Edward P. Westin
Assistant Examiner—Richard Roseen
Attorney, Agent, or Firm—James W. Rose; Daniel H. Kane

[57] ABSTRACT

A FAST OE signal circuit generates FAST OE signals of high and low potential levels. A SLOW OE signal circuit generates SLOW OE signals corresponding to FAST OE signals. The SLOW OE signals have the same high or low potential level as the corresponding FAST OE signals and occur a specified time delay after the corresponding FAST OE signals. A tristate output buffer circuit operates in the bistate mode when enabled by high potential level OE signals for transmitting binary data signals, and operates in a high Z tristate mode when disabled by low potential level OE signals. The FAST OE signal circuit and SLOW OE signal circuit ae coupled in parallel to the tristate output buffer circuit for enabling and disabling the tristate output buffer circuit. The FAST and SLOW OE signals in combination skew the enable time relative to the disable time. The enable times tpZH and tpZL are substantailly longer than the disable times tpHZ and tpLZ, introducing "temporal" separation between active tristate output devices on a common bus to reduce bus contention. A DC Miller killer circuit is coupled to the pulldown transistor element of the tristate output buffer circuit for turning off and holding off the pulldown transistor element in response to high potential level DCMK signals. A DCMK signal circuit generates DCMK signals corresponding to inverted FAST OE signals. A DCMK signal enhancer circuit provides transient enhancement of high potential level DCMK signals in response to corresponding low potential level FAST and SLOW OE signals.

20 Claims, 7 Drawing Sheets

TRISTATE CIRCUITS WITH FAST AND SLOW OE SIGNALS

TECHNICAL FIELD

This invention relates to TTL tristate output circuits which transmit binary data signals of high and low potential levels (H,L) in a bistate mode, and present a high impedance third state (Z) at the output in a tristate mode. In particular the invention provides a new tristate output enable circuit delivering FAST and SLOW OE signals for establishing the high Z third state with relatively fast disable times tpLZ, tpHZ and relatively slow enable times tpZH, tpZL. The skewed enable and disable times avoid bus contention between multiple output devices on a common bus. A new DC Miller killer circuit is also described for the tristate mode with enhanced DCMK signals using the OE FAST and OE SLOW signals.

BACKGROUND ART

A conventional tristate output buffer circuit is illustrated in FIGS. 1 & 2. FIG. 1 provides a logic diagram summary of the circuit implementation of FIG. 2. A basic inverting TTL output buffer circuit B2 when operating in the bistate mode, transmits binary data signals of high and low potential levels from the input $V_{IN}$ to the output $V_{OUT}$. Output buffer circuit B2 incorporates the conventional pullup Darlington transistor element pair Q4, Q5 for sourcing current from the high potential rail $V_{CC}$ to the output $V_{OUT}$. Pulldown transistor element Q3 sinks current from the output $V_{OUT}$ to the low potential rail GND. Phase splitter transistor element Q2 controls the conducting states of the pullup transistor element Q4, Q5 and pulldown transistor element Q3 in opposite phase in response to data signals from input transistor element Q1 which is in turn coupled to the input $V_{IN}$ through diode element D3. Resistors R1, R2 and R3 provide respective current sources from the high potential rail $V_{CC}$ for the switching transistor elements. During operation in the bistate mode, input data signals at high and low potential levels are inverted, amplified, and transmitted to the output $V_{OUT}$ as output data signals at low and high potential levels.

For establishing a high impedance third state Z at the output $V_{OUT}$, a tristate output enable circuit is also provided. The tristate mode is used for operation of the TTL output buffer circuit on a common bus with multiple output circuits. When one of the output buffer circuits is operating in the bistate mode, transmitting binary data signals on the common bus, the other output buffer circuits are "tristated" and present a high impedance at the respective outputs $V_{OUT}$ coupled to the common bus. The tristate mode avoids interference when other output circuits are using the common bus.

The tristate output enable circuit includes an inverting OE buffer circuit B1 with an OE signal input for receiving OE signals of high and low potential level. The OE signals are inverted by the OE buffer circuit B1 providing OE signals at the OE signal output of the OE buffer B1. An OE signal output circuit from the OE buffer B1 is provided by diodes D1 and D2 which couple the OE signals to the pullup transistor element Q4, Q5 and the phase splitter transistor element Q2 respectively. In particular diode D1 provides a one way path from the base of transistor Q4 to the output OE circuit B1 while diode D2 provides a one way path from the base of transistor Q2 to the OE buffer B1.

With an OE high potential level signal (derived from an OE low potential level signal) is applied at the OE signal output circuit, the paths through diodes D1 and D2 are blocked and the TTL output buffer circuit B2 operates in the normal bistate mode, transmitting binary signals from the input $V_{IN}$ to the output $V_{OUT}$. With a low potential level OE signal (derived from a high potential level OE signal) is applied at the OE signal output circuit, diodes D1 and D2 provide discharge paths which discharge the bases of the pullup transistor element Q4 and phase splitter transistor element Q2, respectively. With all of the output switching transistors turned off and held off, the output $V_{OUT}$ presents a high impedance at the common bus.

Causing transition from a binary data signal high potential level H or low potential level L at the output $V_{OUT}$ to the high Z state is referred to herein as tristating or disabling the output buffer circuit. The signal propagation times or transition times for disabling the output buffer circuit are also referred to herein as the disable times tpHZ and tpLZ. Causing transition from the tristate mode back to the bistate mode of operation is referred to herein as enabling the output buffer circuit. The signal propagation times or signal transition times for enabling the output buffer circuits are also referred to herein as enable times tpZH and tpZL.

A disadvantage of the conventional prior art TTL tristate output devices coupled to a common bus is that there may be considerable variation in the binary data signal high and low potential levels with consequent variation and overlap in the enable and disable times for the respective output devices. Furthermore tristate output devices from different logic families with different logic signal potential levels may be coupled to a common bus with further variation and overlap in enable and disable times. Overlap of operation of active output devices on the common bus occurs when the current output device is enabled while a previous output device is not yet disabled. The resulting interference of active output devices on a common bus is known as the "bus contention problem" and may result in false data signals etc.

The tristate output buffer circuit of FIGS. 1 and 2 may incorporate additional circuit features. For example the output buffer circuit B2 may include an AC Miller killer circuit for operation in the bistate mode. The AC Miller killer circuit prevents turn on of the pulldown transistor element Q3 during binary data signal transition from low to high potential level at the output $V_{OUT}$ by discharging any Miller current generated from the collector to base nodes through the internal Schottky diode of pulldown Schottky transistor element Q3. Such an AC Miller killer circuit is described for example in the Robert W. Bechdolt U.S. Pat. No. 4,321,490.

Additionally the output buffer circuit B2 may incorporate a DC Miller killer circuit for operation in the tristate mode. The DC Miller killer circuit similarly discharges the base of the pulldown transistor element Q3 to prevent unintended turn on of the pulldown transistor element Q3 by parasitic Miller current. The DC Miller killer circuit operates during the tristate mode in response to processed OE signals. Such DC Miller killer circuits are described for example in the David A. Ferris U.S. Pat. No. 4,311,927 the Ferris et al. U.S. Pat.

No. 4,581,550, the Farhad Vazehgoo U.S. Pat. No. 4,649,297 etc.

OBJECTS OF THE INVENTION

It is therefore an object of the present invention to provide tristate output buffer circuits for operation of multiple output devices on a common bus which avoid or substantially reduce the bus contention problem.

Another object of the invention is to provide a tristate output enable circuit for tristate output devices which provides separation between the disable and enable times for multiple tristate output buffer circuits on a common bus. The "temporal spacing" of disable and enable events prevents interference by overlapping active output devices on the common bus. The tristate output enable circuit delivers both FAST and SLOW output enable OE signals to implement temporal separation of the enable and disable times and provide a "window" between the disable and enable events of successive active devices on a common bus.

A further object of the invention is to provide a new DC Miller killer circuit for operation in the tristate mode to prevent turn on of the pulldown transistor element. The invention provides a new DCMK signal buffer circuit with transient enhancement of the DCMK signal using the FAST and SLOW OE signals. More generally, the invention may provide transient turn on, transient turn off, transient enhancement and transient suppression of supplemental circuits using the OE FAST and OE SLOW signals.

DISCLOSURE OF THE INVENTION

In order to accomplish these results the present invention provides a tristate circuit with a FAST OE signal circuit for generating FAST OE signals of high and low potential levels and a SLOW OE signal circuit for generating SLOW OE signals corresponding to FAST OE signals. The SLOW OE signals have the same high or low potential level as the corresponding FAST OE signals and occur a specified time delay after the corresponding FAST OE signals. A tristate output buffer circuit operates in the bistate mode when enabled by high potential level OE signals for transmitting binary data signals, and operates in a high Z tristate mode when disabled by low potential level OE signals.

According to the invention the FAST OE signal circuit and SLOW OE signal circuit are coupled in parallel to the tristate output buffer circuit for enabling and disabling the tristate output buffer circuit. A feature and advantage of the parallel coupled OE signal circuits is that the FAST OE signal and SLOW OE signal in combination skew the enable time required for enabling the tristate output buffer circuit relative to the disable time required for disabling the tristate output buffer circuit.

More generally, the invention provides tristate circuit arrangement in which the enable times tpZH and tpZL for transition at the output $V_{OUT}$ from a high Z state to a binary data signal high or low potential level are substantially longer than the disable times tpHZ and tpLZ for transition at the output $V_{OUT}$ from binary data signal high and low potential levels H,L to the high Z state. The controlled fast disable time and controlled slow enable time introduce "temporal" separation between active tristate output devices on a common bus. By avoiding overlap of the disable and enable times, interference between active devices on the common bus is also avoided and the bus contention problem is resolved or substantially reduced.

In another embodiment the invention provides a new DC Miller killer circuit coupled to the pulldown transistor element of the tristate output buffer circuit for turning off and holding off the pulldown transistor element in response to high potential level DCMK signals. A DCMK signal circuit generates DCMK signals corresponding to FAST OE signals. The DCMK signals are inverted relative to the corresponding FAST OE signals.

According to this further embodiment of the invention, a DCMK signal enhancer circuit is coupled to the DCMK signal circuit for transient enhancement of high potential level DCMK signals in response to corresponding low potential level FAST OE signals. The DCMK signal enhancer circuit is also coupled to the SLOW OE signal circuit for turning off the DCMK signal enhancer circuit in response to a low potential level SLOW OE signal a specified time delay after a low potential level FAST OE signal. A feature and advantage of the DC Miller killer circuit is that the DCMK signal enhancer circuit enhances the high potential level DCMK signal and therefore enhances and accelerates turn off of the pulldown transistor element during the transient time interval or "temporal separation" between the FAST OE and SLOW OE signals.

More generally according to the invention, the tristate circuit may incorporate a supplemental circuit coupled to the tristate circuit and having a FAST OE signal input and a SLOW OE signal input. The supplemental circuit turns on in response to the FAST OE signal and turns off in response to the SLOW OE signal a specified time delay after the FAST OE signal. The transient time interval between the FAST OE and SLOW OE signals may generally be used for transient turn on, transient turn off, transient enhancement or transient suppression of supplemental circuits.

In the circuit implementation of the invention, the tristate output enable circuit includes an inverting output enable buffer having an OE signal input for receiving OE signals of high and low potential levels. The inverting output enable buffer has an OE signal output and an OE signal output circuit for delivering OE signals. These OE signals are also referred to herein as the FAST OE signals or OE FAST signals. According to the invention a non-inverting delay state circuit is coupled to the OE FAST signal output of the inverting output enable buffer. The non-inverting delay stage circuit provides an OE SLOW signal output and an OE SLOW signal output circuit coupled in parallel with the OE FAST signal circuit for delivering OE SLOW signals on the OE SLOW signal output circuit. The OE SLOW signals have the same high or low potential level as the corresponding OE FAST signals a specified time delay after the corresponding OE FAST signals on the OE FAST signal output circuit. The parallel coupled OE FAST signals and OE SLOW signals provide the basis for skewing the enable time relative to the disable time for a tristate output buffer circuit.

In the preferred circuit embodiment both the OE FAST signal output circuit and OE SLOW signal output circuit are coupled in parallel to the pullup transistor element and phase splitter transistor element of a tristate output buffer circuit for applying the parallel coupled OE FAST and OE SLOW signals with the OE SLOW signal occurring a specified time delay after the corresponding OE FAST signal.

When the tristate output buffer circuit is disabled, the OE FAST and OE SLOW signals are both at a low potential level. The tristate output buffer circuit is enabled upon transition of the OE FAST and OE SLOW signals to a high potential level. During the time delay, time window, or time interval between the OE FAST and OE SLOW high potential level signals, the OE SLOW signal remains at a low potential level and the OE SLOW signal output circuit continues to disable the output $V_{OUT}$ of the tristate output circuit. Not until the OE SLOW signal output circuit goes to a high potential level is the tristate output circuit enabled. The result is a controlled slow enable time delaying the transition at the output $V_{OUT}$ of the tristate output circuit from the high Z state to a binary data signal high or low potential level H,L. On the other hand the disable time remains fast. In the transition of the OE FAST and OE SLOW signals to a low potential level, either of the OE FAST signal output circuit or OE SLOW signal output circuit alone is able to establish the high Z third state at the output $V_{OUT}$ of the tristate output circuit. The combined OE signal output circuit and OE SLOW signal output circuit operating in parallel effectively function as a logic AND gate.

By implementing a controlled fast disable time and a controlled slow enable time for each of the tristate output buffer circuits on a common bus, a time window is provided between disablement of the previous active tristate output device and enablement of the next active tristate output device. Interference between overlapping active output devices and interference between active output devices from different logic families is therefore minimized.

In the circuit implementation of the DC Miller killer circuit and in particular the DCMK signal buffer circuit, the high potential level DCMK signal enhancer circuit is provided by a second pullup element and in particular a DCMK signal enhancer pullup transistor element coupled in parallel with the first pullup element to the DCMK signal output of the inverting DCMK buffer circuit. An inverting phase splitter transistor element is coupled between the control node of the DCMK signal enhancer pullup transistor element and the OE signal input of the DCMK buffer circuit for controlling the conducting state of the DCMK signal enhancer pullup transistor element. A high potential level DCMK signal at the DCMK signal output is therefore enhanced by the DCMK signal enhancer pullup transistor element in response to a low potential level OE signal at the OE signal input and phase splitter transistor element.

The control node of the DCMK signal enhancer pullup transistor element is also coupled to the OE SLOW signal output circuit without inversion. The second pullup element namely the DCMK signal enhancer pullup transistor element is turned off by the low potential level OE SLOW signal only after the selected time delay of the OE SLOW signal following the corresponding OE FAST signal. Enhancement of a high potential level DCMK signal is therefore only a transient enhancement for the initial discharge and turn off of the pulldown transistor element of a tristate output device in transition to the tristate mode.

Other objects, features and advantages of the invention are apparent in the following specification and accompanying drawings.

DESCRIPTION OF PREFERRED EMBODIMENTS AND BEST MODE OF THE INVENTION

Figure 1:
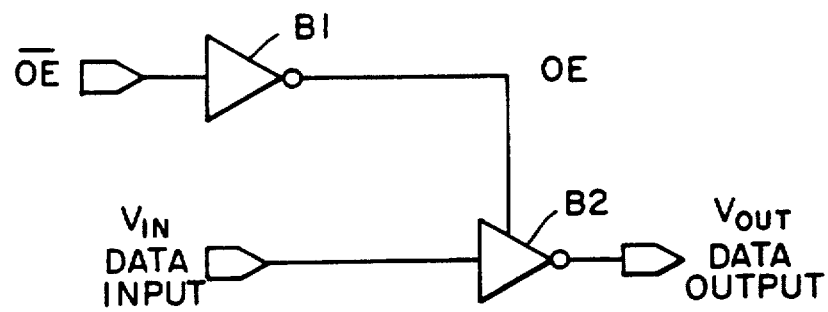
FIG. 1 is a simplified logic diagram of a prior art tristate output buffer circuit.
Figure 2:
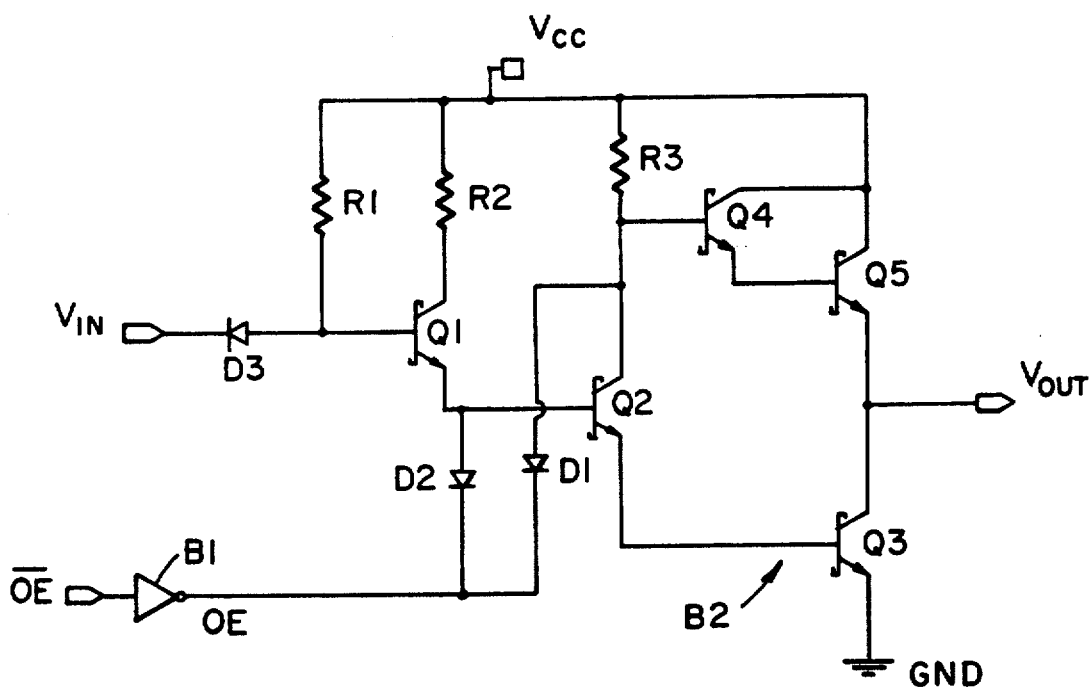
FIG. 2 is a schematic circuit diagram of a circuit implementation of the prior art tristate output buffer circuit.
Figure 3:
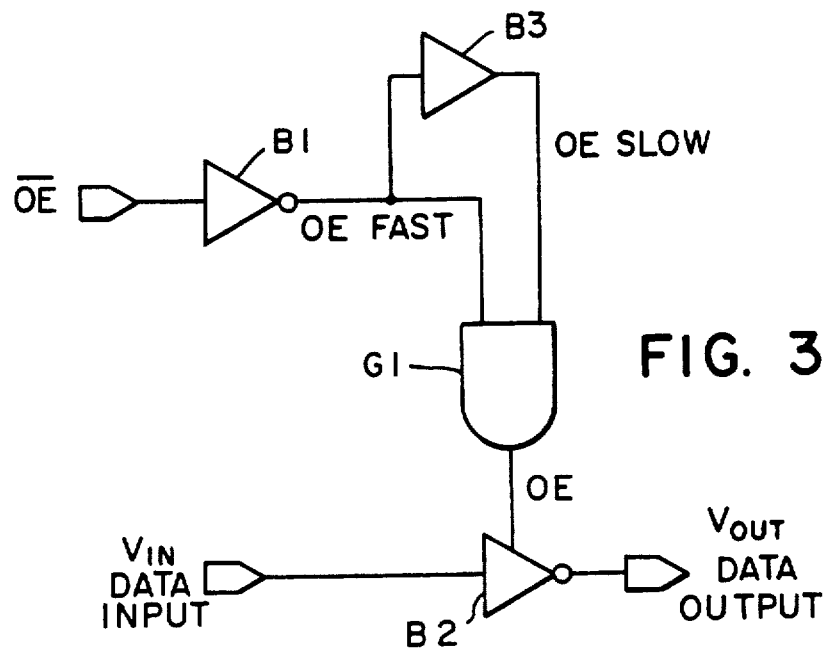
FIG. 3 is a simplified logic diagram of a tristate output buffer circuit according to the invention.
Figure 4:
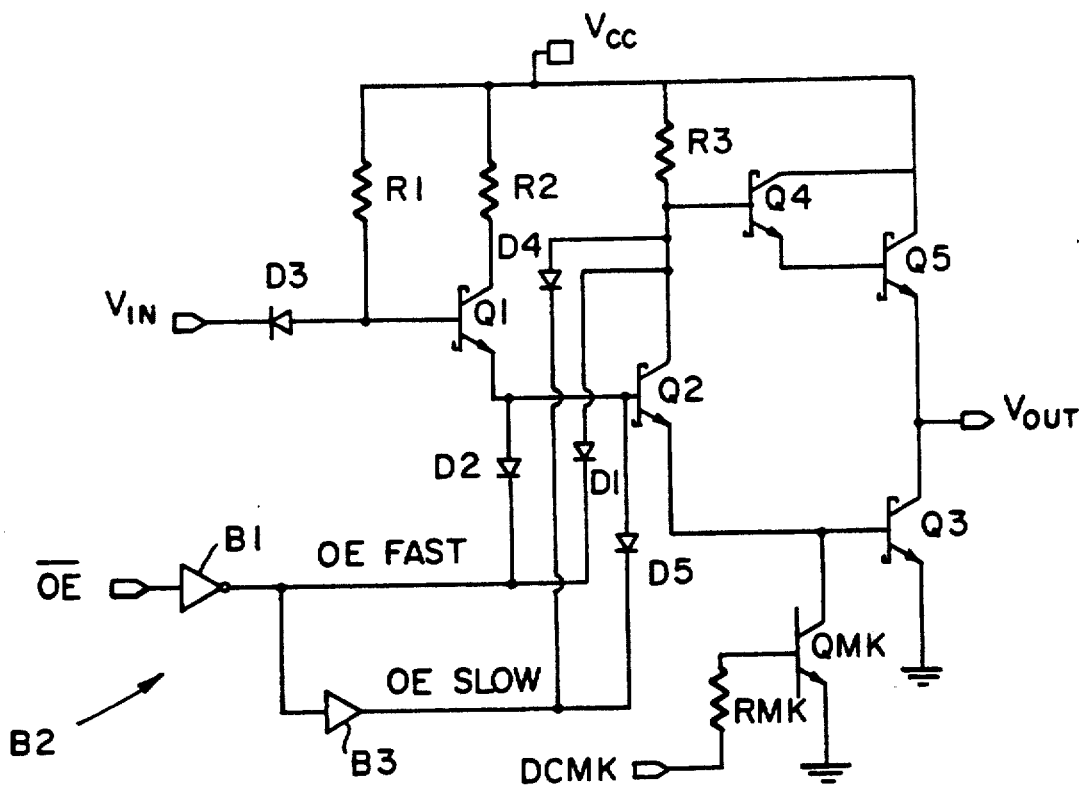
FIG. 4 is a schematic circuit diagram of an example circuit implementation of the tristate output buffer circuit according to the invention.

A tristate output buffer circuit according to the invention is illustrated in the generalized logic diagram of FIG. 3 with an example circuit implementation shown in FIG. 4. Circuit components and circuit elements performing substantially the same functions as the circuit components and elements of FIGS. 1 & 2 are indicated by the same reference designations. As shown in FIG. 3 there is added to the basic logic diagram of a TTL output circuit a non-inverting delay stage circuit B3 having an input coupled to the OE signal output of the inverting output enable buffer B1. The OE signal output from output enable buffer B1 is now referred to as the OE FAST signal output and provides an OE FAST signal input to the non-inverting delay stage circuit B3. The non-inverting delay stage buffer B3 provides an OE SLOW signal output delivering OE SLOW signals having the same high or low potential level value as the corresponding OE FAST signals at the input of the delay stage buffer B3 but delayed a specified time delay after the corresponding OE FAST signals.

As further shown in FIG. 3 the OE FAST signal output from the inverting output enable buffer B1 and the OE SLOW signal output from non-inverting delay stage buffer B3 provide the two inputs of a logic AND gate G1. When either or both of the OE FAST and OE SLOW signal inputs to AND gate G1 are at low potential level, the OE signal at the output of AND gate G1 is also at low potential level disabling the tristate output buffer B2 and maintaining the high Z tristate at the output $V_{OUT}$.

Only when both the OE FAST and OE SLOW signals are at high potential level is the OE output signal from AND gate G1 also at high potential level enabling the tristate output buffer B2 for operation in the bistate mode transmitting binary data signals. Thus, the disable time for transition to the high Z tristate remains fast while the enable time for transition to the bistate mode is delayed by the selected time delay between the corresponding OE FAST and OE SLOW signals.

The circuit implementation of the logical operation in accordance with the AND gate G1 is illustrated in FIG. 4. As shown in FIG. 4, the OE SLOW output from non-inverting delay stage buffer circuit B3 is coupled through an OE SLOW signal output circuit to the pullup transistor elements Q4, Q5 and the phase splitter transistor element Q2 in parallel with the OE FAST signal output circuit from the OE FAST signal output of the inverting output enable buffer B1. As heretofore described the original OE signals, now referred to as the OE FAST signals are coupled from the OE FAST signal output to the base node of pullup transistor element Q4 and the base node of phase splitter transistor element Q2 respectively through diode elements D1 and D2 as heretofore described. The OE SLOW signal output is coupled to the base node of pullup transistor element Q4 and the base node of phase splitter transistor element Q2 respectively through diode elements D4 and D5 in parallel with diode elements D1 and D2. This parallel coupling implements the logic function of an AND gate G1.

As shown in FIG. 4 a DC Miller killer circuit may also be added to the tristate output device. DC Miller killer transistor element QMK is coupled between the base node of the pulldown transistor element Q3 and the low potential rail GND. The DCMK transistor element QMK discharges Miller current passing from the collector to base nodes of pulldown transistor element Q3 when a high potential level DCMK signal is applied at the base node of QMK through ballast resistor RMK. The implementation of the DC Miller killer circuit in accordance with the invention is described below with reference to FIG. 9.

Figure 5:
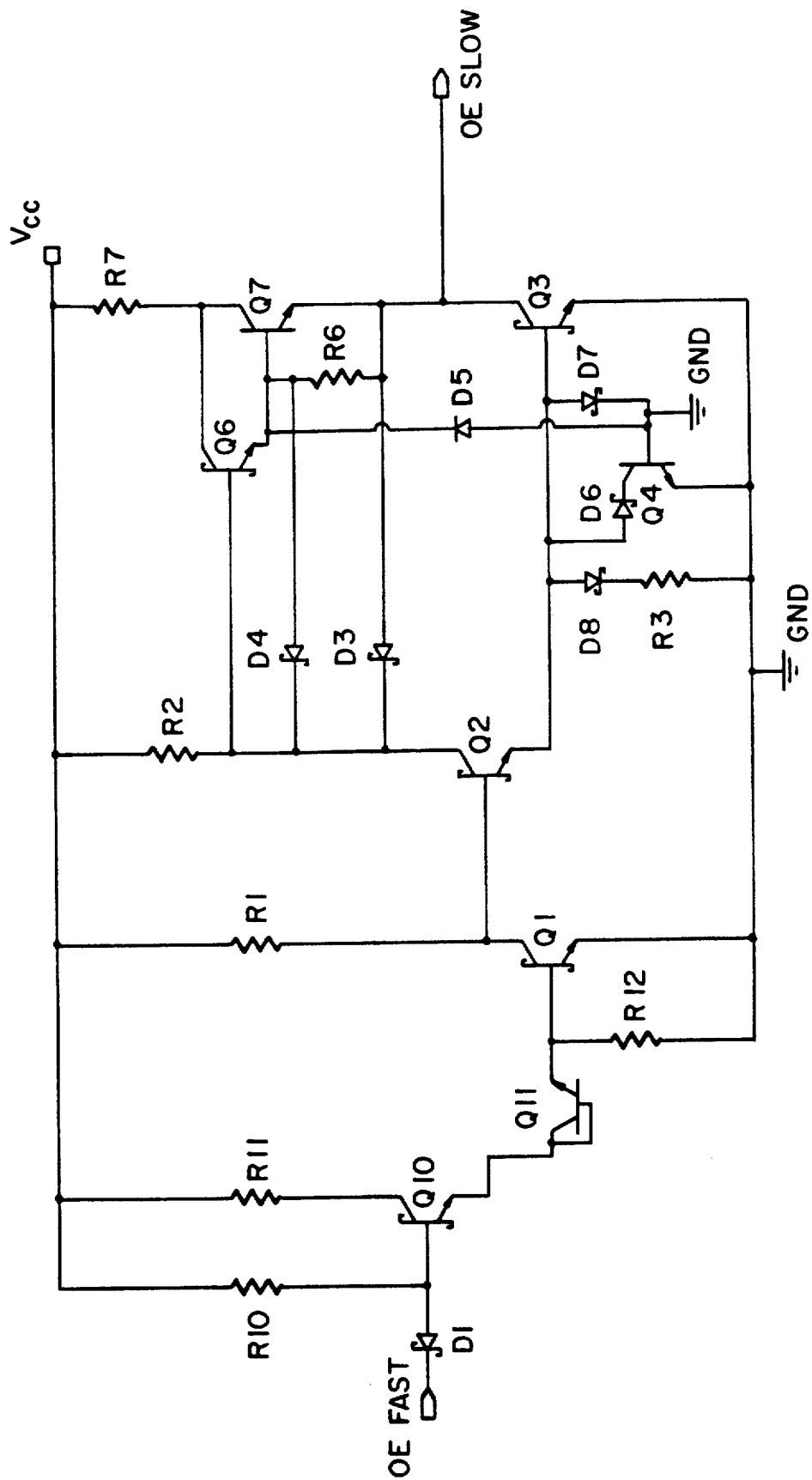
FIG. 5 is a detailed schematic circuit diagram of a non-inverting delay stage circuit for generating OE SLOW signals at an OE SLOW signal output in response to OE signals or OE FAST signals at an OE FAST signal input.

A circuit implementation of the non-inverting delay stage buffer circuit for generating OE SLOW signals is illustrated in FIG. 5. Generally, the non-inverting delay stage circuit is a non-inverting bi-state buffer circuit with pullup transistor element Q6, Q7 coupled between the high potential rail $V_{CC}$ and the OE SLOW signal output, a pulldown transistor element Q3, coupled between the OE SLOW signal output and low potential rail GND, and a phase splitter transistor element Q2 coupled to control the pullup and pulldown transistor elements in opposite phase. The phase splitter transistor element Q2 is inherently inverting because the signal propagating through the buffer circuit is taken from the collector node of phase splitter Q2 to control the base drive to pullup Darlington transistor pair Q6, Q7. As a result a second invertor stage, transistor element Q1 is interposed between the phase splitter transistor element and input transistor element Q10. The base node of transistor element Q10 is coupled to the OE FAST signal input of the buffer circuit through diode element D1. BCS transistor element Q11 provides a further diode drop between the input transistor element Q10 and the invertor stage transistor element Q1. As a result of the double inversion provided by transistor elements Q1 and Q2, the buffer circuit of FIG. 5 is a non-inverting delay stage buffer circuit introducing only the propagation delay between the OE SLOW signal output and the OE FAST signal input.

Other components of the circuit of FIG. 5 include bleed resistors R6 at the base node of transistor Q7, R12 at the base node of transistor Q1, and R3 in a discharge path with Schottky diode D8 at the base node of transistor Q3. Resistors R10, R11, R1, R22 and R7 provide current sources for the switching transistor elements.

Additional features of the circuit of FIG. 5 include an AC Miller killer circuit provided by components Q4, D5, D6 and D7. A feedback circuit from the OE SLOW signal output to the collector node of the phase splitter transistor element Q2 is provided by Schottky diode element D3 to accelerate turn on of the pulldown transistor element Q3 during transition from high to low potential level at the OE SLOW signal output. Schottky diode element D4 discharges the base of pullup transistor element Q7.

Figure 6:
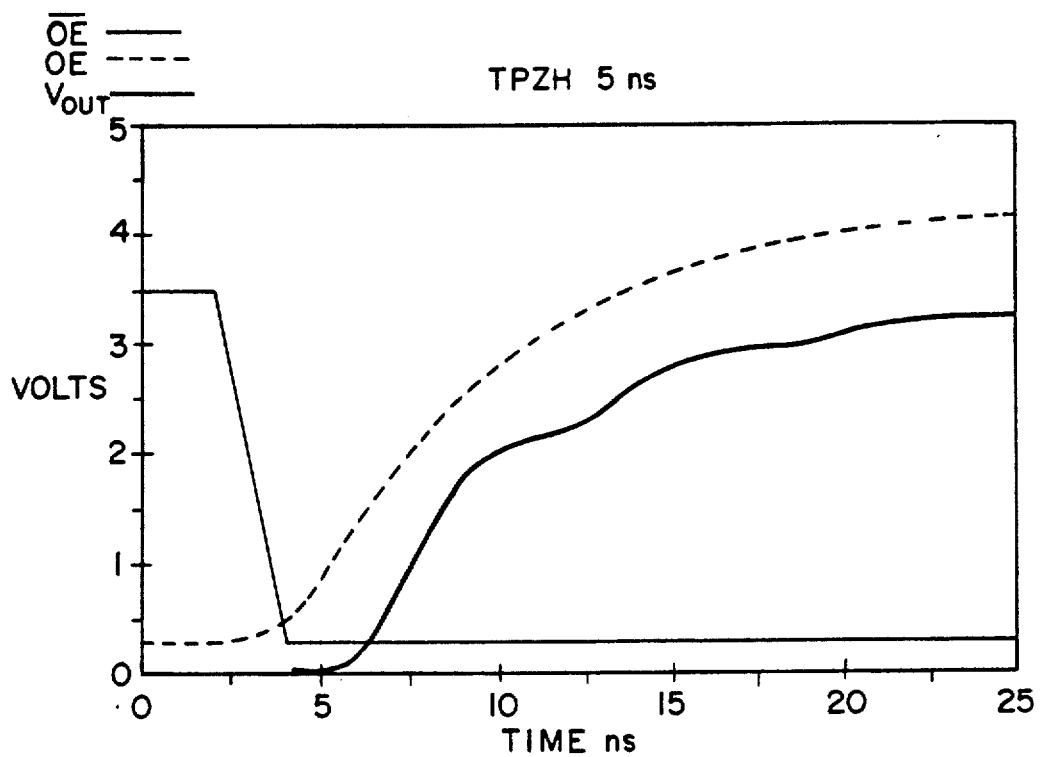
FIG. 6 is a graph showing the FAST enable time tpZH for the prior art tristate output circuit of FIG. 2 with only short delay following the transition to a high potential level OE signal.
Figure 7:
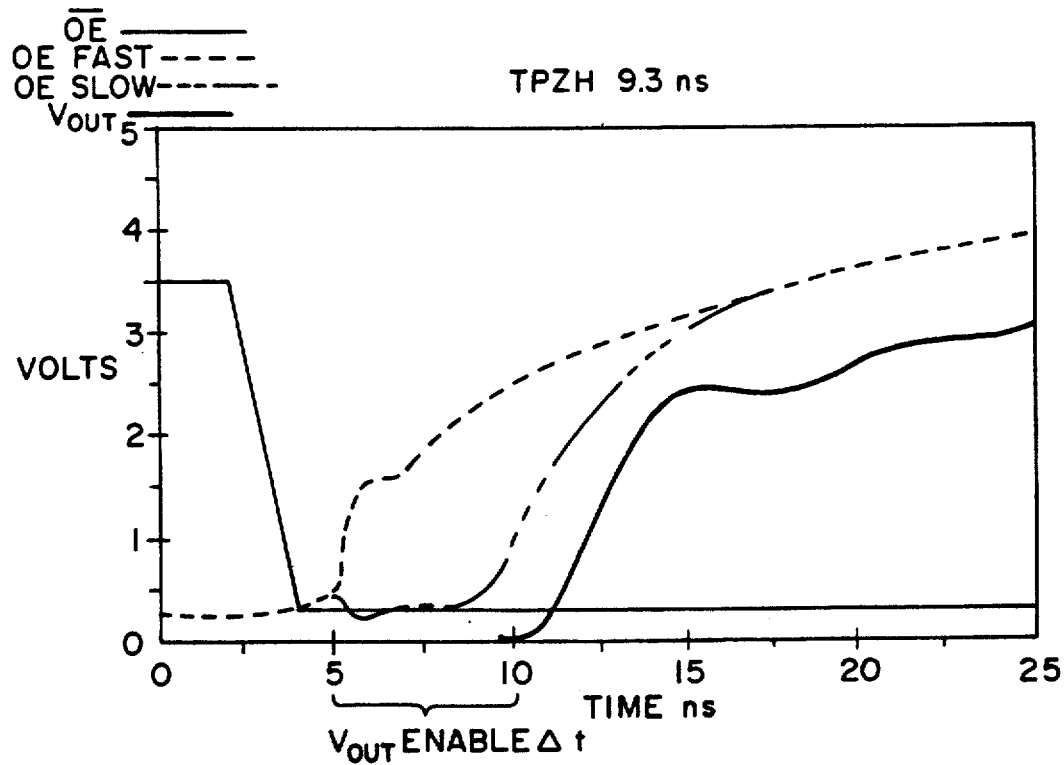
FIG. 7 is a graph showing the relatively SLOW enable time tpZH of the tristate output circuit according to the invention as shown in FIG. 4 with increased delay following the transition to high potential level of first the OE FAST signal and then the OE SLOW signal.
Figure 8:
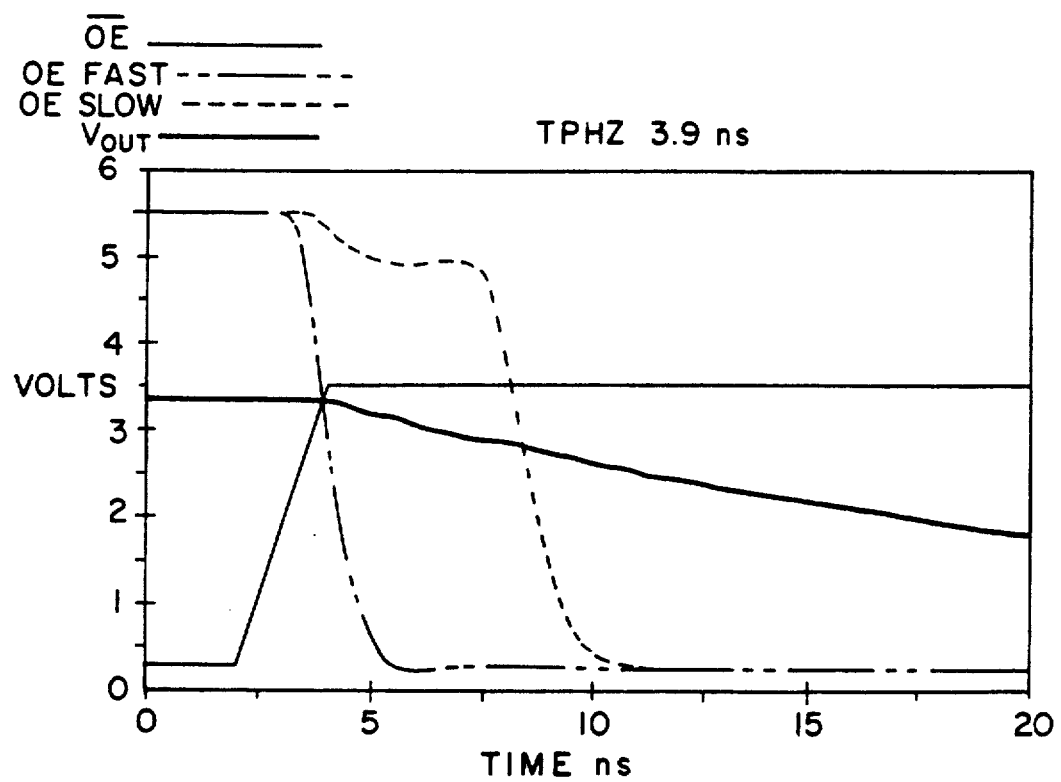
FIG. 8 is a graph showing the FAST disable time tpHZ for the tristate output circuit according to the invention shown in FIG. 4 which remains the same as the disable time for the prior art circuit of FIG. 2.

The graphs of FIGS. 6-8 compare the operation of the tristate output buffer circuit of FIG. 4 and the prior art circuit of FIG. 2. As shown in FIG. 7, the circuit of FIG. 4 introduces a delay of approximately 5 ns in the enable time following transition to a high potential level of both the OE FAST and OE SLOW signals in comparison with the enable time of the circuit of FIG. 2 following transition to a high potential level of the OE FAST signal (or OE signal) only. On the other hand the disable time remains the same for both the circuits of FIGS. 2 & 4 as shown in the graph of FIG. 8.

Figure 9:
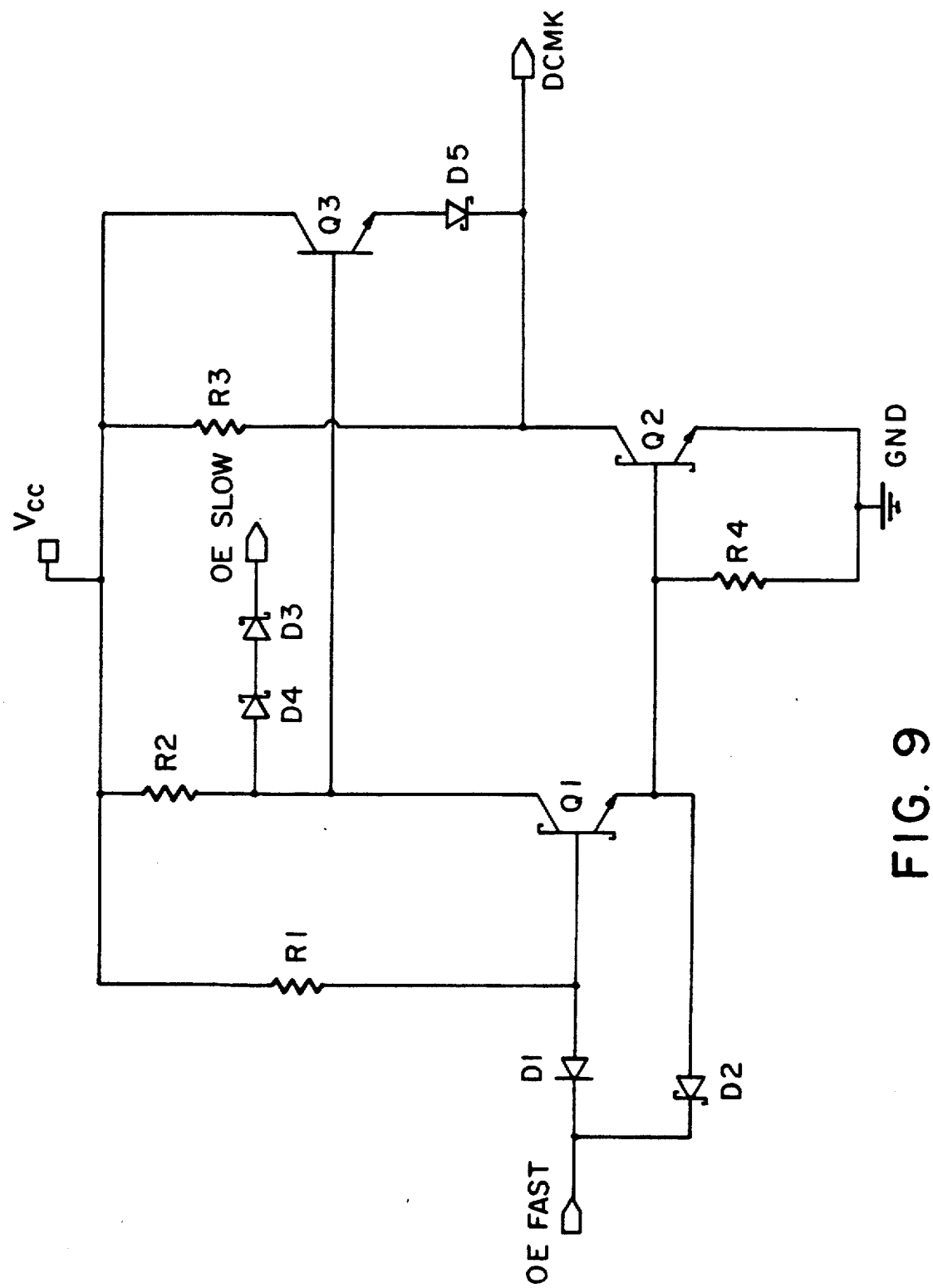
FIG. 9 is a detailed schematic circuit diagram of an inverting DCMK signal generating buffer circuit according to the invention incorporating a high potential level DCMK signal enhancer circuit using the OE FAST and OE SLOW signals.

An inverting DCMK buffer circuit for generating DCMK signals of low and high potential levels, inverted from OE signals or OE FAST signals of high and low potential levels, is illustrated in FIG. 9. The inverting DCMK buffer circuit is part of a DC Miller killer circuit, the remaining portions of which are illustrated as part of the tristate output circuit already, described with reference to FIG. 4 and hereafter described with reference to FIG. 10.

The DCMK buffer circuit of FIG. 9 is an inverting buffer circuit with an OE FAST signal input derived for example from the OE FAST output of the inverting output enable buffer B1 of FIGS. 3 & 4. The DCMK signals at the DCMK signal output have the same high and low potential levels as the original OE input signals to output enable buffer B1 and are inverted from the OE FAST signals. A first pullup element, resistor R3 is coupled between the high potential rail $V_{CC}$ and the output for sourcing current to the DCMK signal output. Pulldown transistor element Q2 is coupled between the output and low potential rail GND for sinking current from the DCMK signal output. Input transistor element Q1 controls the conducting state of the pulldown transistor element Q2. The input transistor element Q1 is coupled to the OE FAST signal input through diode element D1 while the pulldown transistor element Q2 is coupled to the OE FAST signal input through Schottky diode transistor element D2. Resistor R4 is a bleed resistor for the pulldown transistor element Q2 while resistors R1, R2 and R3 provide current sources for the switching transistor elements.

A DCMK signal enhancer circuit for enhancing high potential level DCMK signals is provided by a second pullup element provided by DCMK signal enhancer pullup transistor element Q3 which is coupled between the high potential rail $V_{CC}$ and the DCMK signal output through diode element D5. With respect to the second pullup element, transistor element Q3, and the pulldown transistor element Q2, the input transistor element Q1 functions as a phase splitter transistor element controlling the conducting states of pullup transistor element Q3 and pulldown transistor element Q2 in opposite phase. When an OE FAST signal disables the tristate output circuit, the low potential level OE FAST signal at the OE FAST signal input of the DCMK buffer circuit also provides an enhanced high potential level DCMK signal at the DCMK signal output by means of the DCMK signal enhancer pullup transistor element Q3.

At the same time the base node of pullup transistor element Q3 is coupled to the OE SLOW signal output of the non-inverting delay stage buffer circuit B3 illustrated in FIGS. 3 & 4 and in the circuit implementation of FIG. 5. The base node of pullup transistor element Q3 is coupled to the OE SLOW signal output through Schottky diode elements D3 and D4. Upon occurrence of the low potential level OE SLOW signal a specified propagation delay after the low potential level OE FAST signal at the OE FAST input, the DCMK signal enhancer pullup transistor element Q3 is turned off. The first pullup element, pullup resistor R3 continues to source current to the DCMK signal output for maintaining the high potential level DCMK signal. The DCMK signal enhancer circuit however is available for initial turn on of the DCMK transistor element, designated QMK in FIG. 4 and designated Q13 in FIG. 10, for initial turn off of the output pulldown transistor element, designated Q3 in FIG. 4 and Q2 in FIG. 10. It is during the initial sinking of stored charge for turning off the output pulldown transistor element by the DCMK transistor element that the transient overdrive or enhanced drive is desirable. The steady state is then maintained by the resistor pullup R3.

Thus the OE FAST and OE SLOW signals are used to turn on and turn off the DCMK signal enhancer circuit for transient enhancement of a high potential level DCMK signal during turn off of the TTL tristate output pulldown transistor element. The OE FAST and OE SLOW signals may similarly be applied in other supplemental circuits for transient effects.

Figure 10:
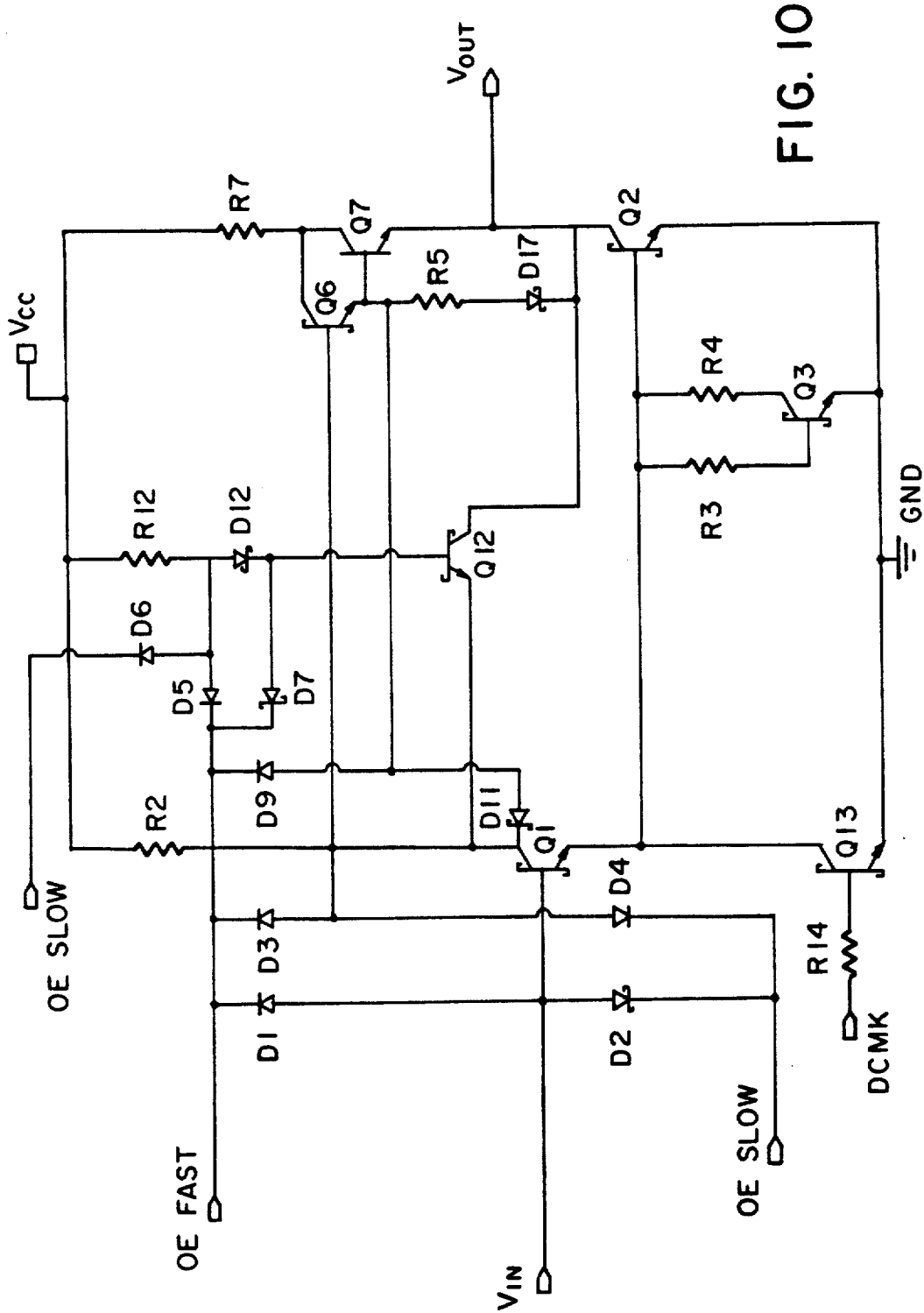
FIG. 10 is a detailed schematic circuit diagram of a full implementation of the TTL tristate output circuit according to the invention including the DC Miller killer circuit.

An example implementation of the tristate circuit features of the invention is further illustrated in the circuit of FIG. 10. The circuit components similar to FIG. 4 are as described above with reference to FIG. 4. In addition a feedback transistor element Q12 is provided between the output $V_{OUT}$ of the tristate output device and the collector node of phase splitter transistor element Q1 to accelerate turn off of the pulldown transistor element Q2 during transition from low to high potential level at the output $V_{OUT}$. For the tristate mode this additional transistor element Q12 must also be turned off and held off by the low potential level OE signals. Both the OE FAST and OE SLOW signal inputs are therefore coupled to the base node of feedback transistor element Q12 through the diode network, D5, D6, D7 and D12. An additional coupling of the base node of pullup transistor element Q7 to the OE FAST signal input is also provided by diode element D9 to further assist in turning off and holding off the pullup Darlington transistor pair Q6, Q7 during the high Z third state.

The DC Miller killer circuit of the invention is also applied in the circuit of FIG. 10 through the DCMK signal input, ballast resistor R14 and DCMK transistor element Q13. The DCMK signals applied at the DCMK signal input are derived from the DCMK buffer circuit of FIG. 9 with transient enhancement of the high potential level DCMK signals as described above.

While the invention has been described with reference to particular example embodiments it is intended to cover all modifications and equivalents within the scope of the following claims.

We claim:

1. A tristate circuit comprising:
   an OE FAST signal circuit for generating OE FAST signals of high and low potential levels;
   an OE SLOW signal circuit for generating OE SLOW signals corresponding to OE FAST signals, said OE SLOW signals having the same high or low potential levels as corresponding OE FAST signals and being delayed a specific time delay after the corresponding OE FAST signals;
   a tristate output buffer circuit having a bistate mode of operation when enabled by high potential level OE signals for transmitting binary data signals, and a high impedance tristate mode when disabled by low potential level OE signals;
   said OE FAST signal circuit and OE SLOW signal circuit being coupled in parallel to selected components of the tristate output buffer circuit for enabling and disabling the tristate output buffer circuit and for delaying the enable time required for enabling the tristate output buffer circuit relative to the disable time required for disabling the tristate output buffer circuit for avoiding bus contention between a plurality of such output buffer circuits on a common bus.

2. The tristate circuit of claim 1 further comprising:
   a DCMK signal circuit for generating DCMK signals corresponding to OE FAST signals, said DCMK signals being inverted relative to the corresponding OE FAST signals;
   said tristate output buffer circuit having a pulldown transistor;
   a DC Miller killer circuit coupled to the pulldown transistor for turning off the pulldown transistor in response to high potential level DCMK signals;
   a DCMK signal enhancer circuit coupled to the DCMK signal circuit for transient enhancement of high potential level DCMK signals in response to corresponding low potential level OE FAST signals;
   said DCMK signal enhancer circuit being coupled to the OE SLOW signal circuit for turning off the DCMK signal enhancer circuit in response to a low potential level OE SLOW signal a specified time delay after a low potential level OE FAST signal.

3. The tristate circuit of claim 1 comprising a supplemental circuit coupled to the tristate circuit having an OE FAST signal input and an OE SLOW signal input for turning on the supplemental circuit in response to an OE FAST signal and turning off the supplemental circuit in response to an OE SLOW signal.

4. A tristate circuit having a bistate mode of operation for transmitting data signals of high and low potential levels from an input to an output, and a tristate mode of operation presenting a high Z state at the output comprising:
- enable circuit means for enabling the tristate circuit for bistate mode operation after a controlled enable time;
- disable circuit means for disabling the tristate circuit for tristate mode operation after a controlled disable time;
- said controlled enable and disable times being skewed so that the enable time is substantially slower than the disable time for delaying the enable time relative to the disable time to avoid bus contention between a plurality of tristate circuits on a common bus.

5. A tristate output circuit having an input for receiving data signals of high and low potential levels and an output for transmitting data signals, pullup transistor for sourcing current to the output from a high potential rail, pulldown transistor for sinking current from the output to a low potential rail, phase splitter transistor for controlling the conducting states of the pullup transistor and pulldown transistor in opposite phase in response to data signals at the input, and a tristate output enable circuit having an OE signal output for delivering OE signals of high and low potential levels and an OE signal output circuit coupled to the pullup transistor and phase splitter transistor for applying OE signals for disabling the tristate output circuit with a high impedance third state at the output in response to a low potential level OE signal and for enabling the tristate output circuit in response to a high potential level OE signal, comprising:
- a non-inverting delay stage circuit coupled to the OE signal output, said delay stage circuit having an OE SLOW signal output and an OE SLOW signal output circuit coupled to the pullup transistor and phase splitter transistor in parallel with the OE signal output circuit for applying an OE SLOW signal having the same high or low potential level as the OE signal a specified time delay after the OE signal thereby skewing enable and disable times by delaying the enable time relative to the disable time for avoiding bus contention between multiple tristate output circuits on a common bus.

6. The tristate output circuit of claim 5 further comprising a DC Miller killer circuit coupled to the pulldown transistor of the tristate output circuit for turning off the pulldown transistor during the high impedance third state, said DC Miller killer circuit comprising:
- a DCMK transistor element coupled to a control node of the pulldown transistor of the tristate output circuit for controlling the conducting state of the pulldown transistor in response to DCMK signals;
- and an inverting DCMK buffer circuit having an OE signal input for receiving OE signals of high and low potential levels, and a DCMK signal output for delivering DCMK signals inverted from the OE signals, said DCMK signal output being coupled to the DCMK transistor element;
- said inverting DCMK buffer circuit having a DCMK signal enhancer circuit coupled to the DCMK signal output for enhancing a high potential level DCMK signal at the DCMK signal output in response to a low potential level OE signal at the OE signal input, said DCMK signal enhancer circuit also being coupled to the OE SLOW signal output circuit for turn off of the DCMK signal enhancer circuit in response to a low potential level OE SLOW signal a specified time delay after the low potential level OE signal.

7. The tristate output circuit of claim 6 wherein the inverting DCMK buffer circuit comprises a first pullup coupled to the DCMK signal output for sourcing current to the DCMK signal output and delivering high potential level DCMK signals, wherein the DCMK signal enhancer circuit means comprises a second pullup coupled in parallel with the first pullup to the DCMK signal output for enhancing a high potential level DCMK signal at the DCMK signal output, said second pullup having a control node, and a DCMK buffer circuit phase splitter transistor means coupled between the control node of the second pullup and the OE signal input for controlling the conducting state of the second pullup in response to OE signals;
- said OE SLOW signal output circuit also being coupled to the control node of the second pullup for applying an OE SLOW signal having the same high or low potential level as the corresponding OE signal a specified time delay after the OE signal;
- thereby turning off the second pullup only after said time delay between corresponding low potential level OE and OE SLOW signals for transient enhancement of a high potential level at the DCMK signal output.

8. The tristate output circuit of claim 7 wherein the second pullup comprises a DCMK signal enhancer pullup transistor element having collector and emitter nodes coupled between the high potential rail and DCMK signal output and having a base node coupled to the DCMK buffer circuit phase splitter transistor element.

9. The tristate output circuit of claim 8 wherein the first pullup comprises a resistor pullup.

10. A tristate output circuit having an input for receiving data signals of high and low potential levels and an output for transmitting data signals, pullup transistor for sourcing current to the output from a high potential rail; pulldown transistor for sinking current from the output to a low potential rail, phase splitter transistor for controlling the conducting states of the pullup transistor and pulldown transistor in opposite phase in response to input data signals comprising:
- an AND gate having first and second inputs including an OE signal first input providing input OE signals of high and low potential levels, and an OE SLOW signal second input providing input OE SLOW signals having the same high or low potential level as corresponding OE signals a specified time delay after the corresponding OE signals, said AND gate having an output coupled to the pullup transistor and phase splitter transistor for applying a low potential level disable signal in response to either low potential level OE or OE SLOW signals, and for applying a high potential level enable signal in response to concurrent high potential level OE and OE SLOW signals, said OE SLOW signals following the OE signals only after said specified time delay thereby skewing the enable time of the tristate output circuit relative to the disable time by delaying the enable time relative to the disable time for avoiding bus contention between multiple tristate output circuits on a common bus.

11. The tristate output circuit of claim 10 comprising a tristate output enable circuit having an OE signal output for delivering OE signals, said OE signal output being coupled to the OE signal first input of the AND gate, and a non-inverting delay stage circuit having an OE signal input coupled to the OE signal output of the tristate output enable circuit, said non-inverting delay stage circuit having an OE SLOW signal output for delivering OE SLOW signals having the same high or low potential level as corresponding OE signals a specified time delay after the corresponding OE signals, said OE SLOW signal output being coupled to the OE SLOW signal second input of the AND gate.

12. The tristate output circuit of claim 11 wherein the AND gate output comprises parallel circuit couplings of the corresponding OE signals and OE SLOW signals respectively to the pullup transistor and phase splitter transistor of the tristate output circuit.

13. An output enable circuit coupled to a tristate output circuit comprising:

an inverting output enable buffer circuit having an $\overline{OE}$ signal input for receiving $\overline{OE}$ signals of high and low potential levels, said inverting output enable buffer having an OE signal output and an OE signal output circuit for delivering OE signals inverted in phase from the $\overline{OE}$ signals at the $\overline{OE}$ signal input;

and a non-inverting delay stage circuit coupled to the OE signal output of the inverting output enable buffer circuit, said non-inverting delay stage circuit having an OE SLOW signal output and an OE SLOW signal output circuit coupled in parallel with the OE signal output circuit for delivering OE SLOW signals on the OE SLOW signal output circuit having the same high or low potential level as the corresponding OE signals a specified time delay after the corresponding OE signal on the OE signal output circuit;

said OE signal output circuit and said OE SLOW signal output circuit being coupled in parallel to selected components of the tristate output circuit for disabling the tristate output circuit in a tristate mode in response to either a low potential level OE signal or a low potential level OE SLOW signal, and for enabling the tristate output circuit in a bistate mode in response to concurrent high potential level OE and OE SLOW signals thereby delaying the enabling time relative to the disabling time for avoiding bus contention between multiple output circuits on a common bus.

14. The output enable circuit of claim 13 wherein the tristate output circuit comprises a DC Miller Killer circuit including DCMK transistor element, and wherein the output enable circuit further comprises an inverting DCMK buffer circuit having an OE signal input coupled to the OE signal output of the inverting output enable buffer circuit and a DCMK signal output for delivering DCMK signals inverted from the OE signals said DCMK signals being coupled to a control node of the DCMK transistor element.

15. The output enable circuit of claim 14 wherein the DCMK buffer circuit comprises a high potential level DCMK signal enhancer circuit coupled to the DCMK signal output for enhancing a high potential level DCMK signal at the DCMK signal output on response to a low potential level OE signal at the OE signal input, said DCMK signal enhancer circuit being coupled to the OE SLOW signal output of the non-inverting delay stage circuit for turning off the DCMK signal enhancer circuit means in response to a low potential level OE SLOW signal a specified time delay after a low potential level $\overline{OE}$ signal at the $\overline{OE}$ signal input of the inverting DCMK buffer circuit.

16. The output enable circuit of claim 15 wherein the DCMK buffer circuit comprises a first pullup coupled between the high potential rail and the DCMK signal output and wherein the DCMK signal enhancer circuit comprises a second pullup coupled in parallel with the first pullup, said second pullup having a control node coupled to the OE SLOW signal output circuit for turning off the DCMK signal enhancer transistor element in response to a low potential level OE SLOW signal at the OE SLOW signal output.

17. A DC miller killer circuit for tristate output circuits having a tristate output, pulldown transistor coupled to the tristate output, a DCMK transistor coupled to the pulldown transistor for turning off the pulldown transistor in response to DCMK signals, comprising:

an inverting DCMK buffer circuit having an OE signal input for receiving OE signals of high and low potential levels, and a DCMK signal output for delivering DCMK signals inverted from the respective OE signals;

said DCMK buffer circuit having a first pullup coupled to the DCMK signal output for sourcing current to provide a high potential level DCMK signal at the DCMK signal output;

said DCMK buffer circuit comprising an OE SLOW signal input circuit with an OE SLOW signal input providing an OE SLOW signal having the same high or low potential level as a corresponding OE signal a specified time delay after a corresponding OE signal at the OE signal input of the DCMK buffer circuit;

said DCMK buffer circuit also comprising a DCMK signal enhancer circuit coupled to the DCMK signal output for enhancing a high potential level DCMK signal at the DCMK signal output in response to a low potential level OE signal at the OE signal input;

said OE SLOW signal input circuit being coupled to the DCMK signal enhancer circuit for turning off the DCMK signal enhancer circuit in response to a low potential level OE SLOW signal a specified time delay after a low potential level OE signal at the OE signal input.

18. The DC Miller killer circuit of claim 17 wherein the DCMK signal enhancer circuit comprises a second pullup coupled in parallel with the first pullup to the DCMK signal output, said second pullup having a control node coupled to the OE SLOW signal input circuit.

19. The DC Miller killer circuit of claim 18 wherein the second pullup comprises a DCMK signal enhancer transistor element having collector and emitter nodes coupled between the high potential rail and the DCMK signal output, said DCMK signal enhancer transistor element having abase node coupled to the OE SLOW signal input circuit means.

20. The DC Miller killer circuit of claim 19 wherein the DCMK buffer circuit comprises a phase splitter transistor element coupled between the base node of the DCMK signal enhancer transistor element and the OE signal input for controlling the conducting state of the DCMK signal enhancer transistor element in response to OE signals at the OE signal input, said OE SLOW signal input circuit also being coupled to the base node of the DCMK signal enhancer transistor element for controlling the conducting state of the DCMK signal enhancer transistor element in response to OE SLOW signals.

* * * * *